(12) United States Patent
Sato et al.

(10) Patent No.: US 8,431,224 B2
(45) Date of Patent: Apr. 30, 2013

(54) RESIN COMPOSITION FOR FORMING INSULATING LAYER OF PRINTED WIRING BOARD

(75) Inventors: Tetsuro Sato, Shiraoka-machi (JP); Toshifumi Matsushima, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 701 days.

(21) Appl. No.: 12/530,534

(22) PCT Filed: Mar. 21, 2008

(86) PCT No.: PCT/JP2008/055222
§ 371 (c)(1),
(2), (4) Date: Dec. 9, 2009

(87) PCT Pub. No.: WO2008/114858
PCT Pub. Date: Sep. 25, 2008

(65) Prior Publication Data
US 2010/0108368 A1 May 6, 2010

(30) Foreign Application Priority Data
Mar. 20, 2007 (JP) .................................. 2007-073703

(51) Int. Cl.
*B32B 15/092* (2006.01)
*B32B 27/38* (2006.01)
*B05D 3/02* (2006.01)
*C08G 59/30* (2006.01)
*C08G 59/38* (2006.01)
*C08G 59/40* (2006.01)
*C08L 63/00* (2006.01)

(52) U.S. Cl.
USPC ........ 428/416; 427/386; 427/388.1; 428/413; 428/414; 428/418; 428/901; 523/427; 523/428; 523/433; 525/524; 525/525; 525/528; 525/538

(58) Field of Classification Search .................. 427/386, 427/388.1; 428/413, 414, 416, 418, 901; 523/427, 428, 433; 525/523, 524, 525, 528, 525/538
See application file for complete search history.

(56) References Cited

U.S. PATENT DOCUMENTS

| | | | |
|---|---|---|---|
| 6,132,851 A | 10/2000 | Poutasse | |
| 6,165,617 A * | 12/2000 | Satoh et al. ................ | 428/418 |
| 6,291,626 B1 * | 9/2001 | Wang et al. ................ | 528/99 |
| 6,716,530 B2 | 4/2004 | Sato et al. | |
| 2003/0087101 A1 | 5/2003 | Sato et al. | |
| 2006/0003165 A1 * | 1/2006 | Akatsuka et al. ............ | 428/413 |
| 2006/0166005 A1 * | 7/2006 | Sato et al. ................ | 428/418 |

FOREIGN PATENT DOCUMENTS

| | | |
|---|---|---|
| JP | 8-048960 | 2/1996 |
| JP | 11-348177 | 12/1999 |
| JP | 2000-256537 | 9/2000 |
| JP | 2000309623 A * | 11/2000 |
| JP | 2001-024324 | 1/2001 |
| JP | 2001-181475 | 7/2001 |
| JP | 2001-244589 | 9/2001 |
| JP | 2002-003702 | 1/2002 |
| JP | 2002-179772 | 6/2002 |
| JP | 2002194313 A * | 7/2002 |
| JP | 2002-241473 | 8/2002 |
| JP | 2002-359444 | 12/2002 |
| JP | 2003298230 A * | 10/2003 |
| JP | 2004-082347 | 3/2004 |
| JP | 2005002294 A * | 1/2005 |
| WO | WO 9716948 A1 * | 5/1997 |

OTHER PUBLICATIONS

Machine translation of JP 2005002294 A, provided by the JPO website.*
Machine translation of JP 2000309623 A, provided by the JPO website.*
Machine translation of JP 2002194313 A, provided by the JPO website.*
Machine translation of JP 2003298230 A, provided by the JPO website.*
Machine translation of JP 2000256537 A, provided by the JPO website.*
Machine translation of JP 2002003702 A, provided by the JPO website.*
Machine translation of JP 2001181475 A, provided by the JPO website.*
International Search Report for PCT/JP2008/055222, mailed May 1, 2008.
International Preliminary Report on Patentability for PCT/JP2008/055222, issued Sep. 22, 2009.

* cited by examiner

*Primary Examiner* — Michael J Feely
(74) *Attorney, Agent, or Firm* — Greenblum & Bernstein, P.L.C.

(57) ABSTRACT

Disclosed is a halogen-free resin composition for printed wiring board production, which is remarkably reduced in quality deterioration due to moisture absorption of a semi-cured resin film (layer). Also disclosed is a copper film with resin or the like. The resin composition is characterized by containing a component A (one or more resins selected from the group consisting of bisphenol-A epoxy resins, bisphenol-F epoxy resins and bisphenol-AD epoxy resins, which have an epoxy equivalent of not more than 200, while being in a liquid state at 25 DEG C.), a component B (a linear polymer having a crosslinkable functional group), a component C (a crosslinking agent), a component D (an imidazole-based epoxy resin curing agent) and a component E (a phosphorus-containing epoxy resin). The resin composition is also characterized by containing 0.5-3.0% by weight of phosphorus atoms per 100% by weight of the resin composition. In the copper foil with resin, a resin layer is formed by using the resin composition.

8 Claims, No Drawings

RESIN COMPOSITION FOR FORMING INSULATING LAYER OF PRINTED WIRING BOARD

TECHNICAL FIELD

The invention according to the present application relates to a resin composition for forming an insulating layer of a printed wiring board, a resin coated copper foil and a method for manufacturing the resin coated copper foil. The invention particularly relates to a resin coated copper foil in which deterioration of performance of a resin layer caused by moisture adsorption into a semi-cured resin layer constituting resin coated copper foil is reduced before processing into a copper clad laminate.

BACKGROUND ART

The resin coated copper foil has been used for various applications in the field of manufacturing printed wiring boards. For example, Patent Document 1 discloses adopting of the resin coated copper foil without resin on a peripheral region to prevent generation of dents at the rear surface of a resin coated copper foil, and the construction of the resin coated copper foil is utilized for preventing of dents in hot pressing.

In addition, Patent Document 2 discloses a method for laminating a resin coated copper foil on an inner layer board for forming a build-up layer in a build-up process for printed wiring board. To finish a precise pattern accurately, target is set to prevent generation of dimples on the copper foil around IVHs in hot-pressing to perform reliable adhesion with a dry-film resist without bubbles. To achieve the object, resin coated copper foil having a requisite thickness of copper foil is used to minimize the level of dimple not to affect proccessability even the resin component comprising the resin coated copper foil flow into IVHs of the inner layer.

Alternatively, the resin coated copper foil has excellent migration resistance because of no inclusion of reinforcements in the resin layer. Same time, it has been used for the application which requires less weave pattern on the laminate which is caused when glass cloth in a per-preg as a reinforcement is used. For example, Patent Document 3 discloses the technology to prevent a wiring layer and wiring pattern from contact with the glass fiber provided in the glass fiber reinforced substrate by arranging an insulating film containing no glass fiber among a glass fiber reinforced substrate. As a result, even in the operation with a high voltage, risk of insulation failure between wiring layer and wiring pattern is prevented and cost increase to finish a printing wiring board etc. is minimized. More specifically, the printed wiring board disclosed is characterized in that the dielectric layer containing no glass fiber is made of an insulating resin portion of the resin coated copper foil, and the copper foil portion of the resin coated copper foil is made to be a copper foil layer where the wiring pattern is formed. The document discloses that migration resistance may be improved and adhesion among the insulating layer, the wiring layer and the wiring pattern may be improved as a result and high reliability and long shelf life can be achieved in the printed wiring board.

As is apparent from the descriptions above, the resin coated copper foil has been used for overcoming drawbacks of a printed wiring board caused by its construction.

The present applicant have been engaged in the invention disclosed in Patent Document 4 disclosing technology directing to the most suitable resin coated copper foil for the aforementioned applications. Technology disclosed in the Patent Document 4 is directing to provide halogen-free resin coated copper foil having excellent flame retardant property, excellent moisture resistance, heat resistance, and enough peel strength between a substrate and a copper foil, and employs halogen-free resin composition which is characterized by containing an epoxy resin comprising an epoxy resin curing agent which contains nitrogen in an amount of 5 to 25 wt %, a thermosetting maleimide compound, for forming a resin layer constituting resin coated copper foil.

Furthermore, the present applicant disclose the following technology in Patent Document 5 which is directing to provide resin coated copper foil for manufacturing a printed wiring board having properties well-balanced in flame retardant property, resin flowability, moisture resistance and peel strength. The technology discloses a resin coated copper foil comprising a resin layer on one side of copper foil and is characterized in that the resin layer is formed of a resin composition containing (a) a high-molecular weight polymer having an intermolecular crosslinkable functional group and a crosslinking agent thereof (5 to 30 parts by weight), (b) an epoxy resin which is liquid state at 25° C. (5 to 30 parts by weight) and (c) a compound having a structure represented by Formula 4 (40 to 90 parts by weight).

[Formula 4]

$$\underset{\text{where R is H or } -CH_2-\overset{O}{\underset{\diagup\diagdown}{CH}}-CH_2}{}$$

In the inventions disclosed in Patent Documents 4 and 5 mentioned above, finished printed wiring board performs excellent flame retardant property, excellent moisture resistance, heat resistance, etc. and enough peel strength between a substrate and copper foil, and offers performance over conventional resin coated copper foil. That is, the excellent moisture resistance referred to in the inventions disclosed in Patent Documents 4 and 5 is the moisture resistance of the fully-cured state of resin which constitutes resin coated copper foil.

[Patent Document 1] Japanese Patent Laid-Open No. 11-348177
[Patent Document 2] Japanese Patent Laid-Open No. 2001-24324
[Patent Document 3] Japanese Patent Laid-Open No. 2001-244589
[Patent Document 4] Japanese Patent Laid-Open No. 2002-179772
[Patent Document 5] Japanese Patent Laid-Open No. 2002-359444

DISCLOSURE OF THE INVENTION

Problems to be Solved by the Invention

However, as a result of intensive studies conducted by the inventors of the present application, it has been made clear that the quality stability of resin coated copper foil before the resin is fully-cured is extremely important to ensure excellent flame retardant property of finished printed wiring board. Then, it has been required for the present inventors to make the quality of a semi-cured resin layer constituting resin coated copper foil stable before the resin layer constituting the resin coated copper foil is fully-cured.

Means for Solving the Problems

Then, after intensive studies of the present inventors, they thought out a resin composition capable for solving the aforementioned problems. Now, the outline of the present invention will be demonstrated more specifically.

<Resin Composition>

A resin composition according to the present application is a resin composition for forming an insulating layer of a printed wiring board which performs moisture absorption resistance in a semi-cured state, and the resin composition contains components A to E and phosphorus atoms in an amount in the range of 0.5 wt % to 3.0 wt % against to 100 wt % of the resin composition.

component A: One or more types of resin selected from the group consisting of bisphenol-A epoxy resin, bisphenol-F epoxy resin and bisphenol-AD epoxy resin, all having an epoxy equivalent of 200 or less and which is liquid state at 25° C.;

component B: A linear polymer having a crosslinkable functional group;

component C: A crosslinking agent;

component D: An imidazole functional epoxy resin curing agent; and component E: A phosphorus-containing epoxy resin.

As for the linear polymer having a crosslinkable functional group, component B constituting a resin composition according to the present application, it is preferable to use a polymer component soluble in an organic solvent of which boiling point is 50° C. to 200° C.

Furthermore, as for the phosphorus-containing epoxy resin, component E constituting a resin composition according to the present application, it is preferable to use an epoxy resin obtained as a derivative from 9,10-dihydro-9-oxa-10-phosphaphenanthrene-10-oxide represented by formula 6 shown below having two or more intermolecular epoxy groups.

Furthermore, as for the epoxy resin, component E, it is preferable to use one or mixture of two types selected from compounds having structural formulas represented by Formulas 7 to 9 shown below.

Furthermore, as for the crosslinking agent, component C constituting a resin composition according to the present application, it is preferable to use a urethane resin.

In the resin composition according to the present invention described above, it is preferable to use a mixture which contains 3 to 20 parts by weight of component A, 3 to 30 parts by weight of component B and 1 to 5 parts by weight of component D against to 100 parts by weight of the resin composition.

<Resin Coated Copper Foil>

Resin coated copper foil according to the present application is resin coated copper foil for manufacturing a printed wiring board having a resin layer on one side of a copper foil characterized in that the resin layer is formed as a semi-cured resin layer having a thickness of 5 μm to 100 μm by using the resin composition described above.

In the resin coated copper foil of the present application, it is preferable to have a silane coupling treatment layer on the surface of the copper foil for manufacturing a resin coated copper foil on which resin layer is formed.

<Method for Manufacturing Resin Coated Copper Foil>

A method for manufacturing resin coated copper foil according to the present application is a method for manufacturing resin coated copper foil for printed wiring board characterized in that a resin varnish used to form a resin layer is prepared in accordance with steps a and b described below in this order, the resin varnish is applied on one side of copper foil, a resin coated copper foil comprising a semi-cured resin layer having a thickness calculated from weight of 5 μm to 100 μm is finished by drying.

step a: Preparation of a resin composition by mixing component A (one or more types of resin selected from the group consisting of bisphenol-A epoxy resin, bisphenol-F epoxy resin and bisphenol-AD epoxy resin, all having an epoxy equivalent of 200 or less and which is liquid state at 25° C.), component B (a linear polymer having a crosslinkable functional group), component C (a crosslinking agent), component D (an imidazole functional epoxy resin curing agent) and component E (a phosphorus-containing epoxy resin) and amount in parts-by-weight of component E is determined to make the range of phosphorus atoms fall in 0.5 wt % to 3.0 wt % against to 100 wt % of the resin composition; and step b: Dissolving of the resin composition in an organic solvent to prepare a resin varnish containing a resin solid content of 25 wt % to 50 wt %.

In the method for manufacturing the resin coated copper foil according to the present application, as for the phosphorus-containing epoxy resin, component E, it is preferable to use an epoxy resin obtained as a derivative from 9,10-dihydro-9-oxa-10-phosphaphenanthrene-10-oxide having two or more intermolecular epoxy groups.

<Printed Wiring Board>

A printed wiring board according to the present application is characterized in that the insulating layer is formed by using the resin composition described above.

Advantages of the Invention

A resin composition according to the present application has a halogen-free composition having a low environment load and provides a resin layer which is excellent in moisture absorption resistance in a semi-cured state. As a result, even if the resin layer in a semi-cured state is stored in a high-temperature and humid environment for a long time, the quality of the resin layer in fully-cured state is not made poor. Therefore, the resin coated copper foil having the resin layer using the resin composition has excellent in long-term shelf life. Even if the resin coated copper foil is stored in a high-temperature and humid environment for a long time, the quality deterioration of the resin coated copper foil is extremely small. It means that the printed wiring board manufactured by using the resin composition or the resin coated copper foil is prevented from blistering which tends to happen on the printed wiring board in the solder reflow process where temperature of melting solder is loaded when moisture absorbed deteriorate resin layer.

BEST MODE FOR CARRYING OUT THE INVENTION

Now, the best mode for carrying out of the invention will be described item by item below.

Embodiment of Resin Composition

A resin composition according to the present application is to be used for forming an insulating layer of a printed wiring board and a resin composition in a semi-cured state performs moisture absorption resistance. The resin composition is a halogen-free resin composition for forming an insulating layer of a printed wiring board characterized by containing the following components A to E and phosphorus atoms in an amount in the range of 0.5 wt % to 3.0 wt % against to 100 wt % of the resin composition.

The reason why the resin composition contains phosphorus atoms in an amount in the range of 0.5 wt % to 3.0 wt % against to 100 wt % of the resin composition is to ensure flame retardant property of the resin layer after fully-cured. If the content of the phosphorus atoms is less than 0.5 wt %, good flame retardant property cannot be obtained. On the other hand, even the content of the phosphorus atoms exceeds 3.0 wt %, flame retardant property of the resin layer after fully-cured may not be improved. Now, components of the resin composition will be individually described below.

Component A is so-called bisphenol type epoxy resin and preferably a single resin or a mixture of not less than two types of resins selected from the group consisting of bisphenol-A epoxy resin, bisphenol-F epoxy resin and bisphenol-AD epoxy resin. The reason why a bisphenol type epoxy resin is selected is that the epoxy resin is liquid state at 25° C. Therefore, after finishing a resin coated copper foil comprising a resin layer in a semi-cured state, a significant effect to reduce curling can be obtained. In addition, appropriate flow of the resin to follow a convexo-concave shape of the surface and the good adhesion of the resin layer to the copper foil is performed in fully-cured state. By the way, in the liquid epoxy of a high purity, when it is excessively cooled and returned to room temperature, a crystalline state may be maintained and it looks to be a solid. For such an epoxy resin, as it can be used after making it to be a liquid state, such kind of epoxy are included in the liquid-state epoxy resin mentioned herein. Furthermore, the reason why the temperature specifically described as 25° C. is to demonstrate "about room temperature".

When the epoxy equivalent exceeds 200, the resin may be a semi-solid state or a solid state and it makes difficult to prepare a resin composition at 25° C., so it is not preferable. In addition, curling in the resin coated copper foil finished may not be reduced. Anyhow, the epoxy equivalent disclosed herein is the resin weight (number of grams: g/eq) which contains 1 gram equivalent of an epoxy function. In addition, as long as the aforementioned bisphenol type epoxy resins are used, they may be used alone or as a mixture of two types or more. When not less than two types of resins are used as a mixture, the mixing ratio of them is not particularly limited.

The bisphenol type epoxy resin is blended to be contained in a ratio of 3 to 20 parts by weight against to 100 parts by weight of the resin composition. When the content of the bisphenol type epoxy resin is less than 3 parts by weight, the resin after fully-cured becomes brittle and the resin may be easily broken. On the other hand, when the content of the bisphenol type epoxy resin exceeds 20 parts by weight, the resin surface may be sticky at 25° C. to lose handling ability.

Component B is a linear polymer having a crosslinkable functional group. The linear polymer having a crosslinkable functional group preferably has a functional group contributing to the hardening reaction of an epoxy resin, such as a hydroxide group and a carboxyl group. The linear polymer having a crosslinkable functional group is preferably soluble in an organic solvent of which boiling point is 50° C. to 200° C. Specific examples of the linear polymer having a functional group include a polyvinyl acetal resin, a phenoxy resin, a polyethersulfone resin and a polyamideimide resin.

The linear polymer having a crosslinkable functional group is used in a blending ratio of 3 to 30 parts by weight against to 100 parts by weight on the resin composition. When the blended ratio of the linear polymer having a crosslinkable functional group is less than 3 parts by weight, the flowability of the resin may increase. As a result, generation of powdery resin may tend to be observed at the edge of the manufactured copper clad laminate. In addition, moisture absorption resistance of the resin layer in a semi-cured state cannot be improved. On the other hand, when the blending ratio exceeds 30 parts by weight, the flowability of resin may decrease to result that defects such as voids tend to appear in the insulating layer of the finished copper clad laminate.

Furthermore, the organic solvent of which boiling point is 50° C. to 200° C. practically exemplified are single solvent or mixture of not less than two types of solvents selected from the group consisting of methanol, ethanol, methyl ethyl ketone, toluene, propylene glycol monomethyl ether, dimethyl formamide, dimethyl acetamide, cyclohexanone and ethyl cellosolve. When organic solvent of which boiling point is less than 50° C., significant vaporization of the solvent occurs by heating to hardly result a preferable semi-cured state when the resin varnish is made to be semi-cured resin. On the other hand, when organic solvent of which boiling point is exceeding 200° C., the solvent tends to remain in a semi-cured resin. It means that the vaporization rate usually required of the solvent is not satisfied to fail in industrial productivity.

Component C serves as a crosslinking agent for generating the crosslinking reaction between component B and an epoxy resin. As for the crosslinking agent, it is preferable to use a urethane resin. The crosslinking agent should be added according to the mixing amount of component B. Therefore, it is considered that the blending ratio of the crosslinking agent itself is not required to be strictly specified. However, the crosslinking agent is preferably used in the blending ratio of not more than 10 parts by weight against to 100 parts by weight of the resin composition. This is because when component C (as a urethane resin) is included in excess of 10 parts by weight, the moisture absorption resistance of the semi-cured resin layer is made to be poor to result brittle resin layer in fully-cured state.

Component D is an imidazole epoxy resin curing agent. In the resin composition according to the present invention, in view of improving the moisture absorption resistance of a semi-cured resin layer, it is preferable to selectively use an imidazole epoxy resin curing agent. Particularly, it is preferable to use an imidazole epoxy resin curing agent having a structural formula represented by Formula 5 below. If an imidazole epoxy resin curing agent having a structural formula represented by Formula 5 is used, the moisture absorption resistance of a semi-cured resin layer can be significantly improved and excellent long-term storage stability can be provided. Note that, as for the amount of the epoxy resin curing agent to be added against to the epoxy resin, an optimal amount is preferable to be experimentally specified in place of the amount calculated from a reaction equivalent. It is because that the imidazole epoxy resin curing agent performs as catalyst in curing of an epoxy resin and it works as a reaction generating agent that induces self-polymerization reaction of an epoxy resin in the beginning of the curing reaction.

[Formula 5]

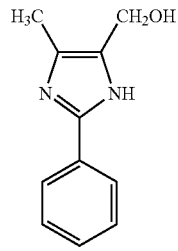

Component E is a phosphorus-containing epoxy resin. The phosphorus-containing epoxy resin is a general term for expressing an epoxy resin containing phosphorus in the epoxy skeleton. Any phosphorus-containing epoxy resin can be used as long as it can make contained phosphorus atoms in the range of 0.5 wt % to 3.0 wt % against to 100 wt % of the resin composition according to the present application. However, it is preferable to use an epoxy resin obtained as a derivative from 9,10-dihydro-9-oxa-10-phosphaphenanthrene-10-oxide and having two or more intermolecular epoxy groups. This is because the quality stability of a semi-cured resin is excellent and the flame retardant property is excellent also. The chemical formula of 9,10-dihydro-9-oxa-10-phosphaphenanthrene-10-oxide will be exemplified in Formula 6.

[Formula 6]

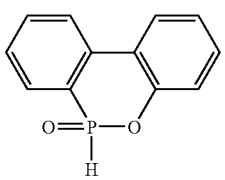

As a specific example of the epoxy resin obtained as a derivative from 9,10-dihydro-9-oxa-10-phosphaphenanthrene-10-oxide, a compound having a chemical formula shown in Formula 7 is preferably used. This is because the quality of a semi-cured resin is excellent and the flame retardant property is excellent also.

[Formula 7]

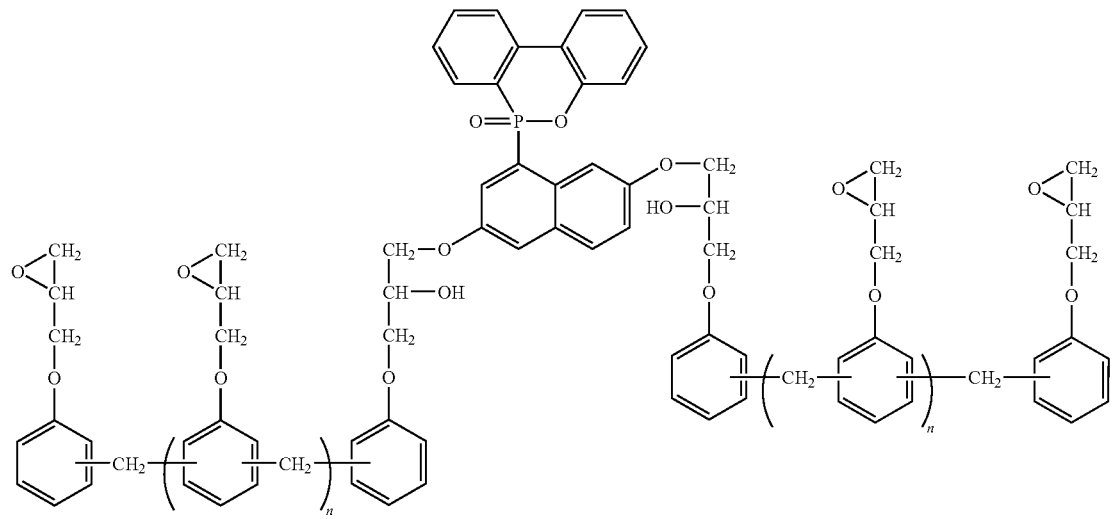

Furthermore, as the phosphorus-containing epoxy resin, component E, a compound having a chemical formula shown in Formula 8 is also preferable. This is because, similarly to the phosphorus-containing epoxy resin shown in Formula 7, the quality stability of a semi-cured resin is excellent and the flame retardant property is excellent also.

[Formula 8]

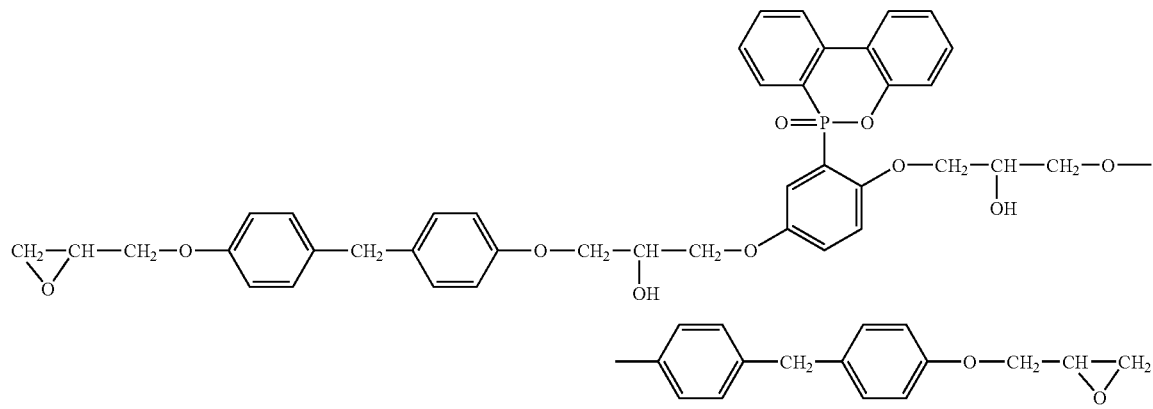

Furthermore, the phosphorus-containing epoxy resin, component E, a compound having a chemical formula shown in Formula 9 is also preferable. This is because, similarly to the phosphorus-containing epoxy resins shown in Formulas 7 and 8, the quality stability of a semi-cured resin is excellent and the flame retardant property is excellent also.

[Formula 9]

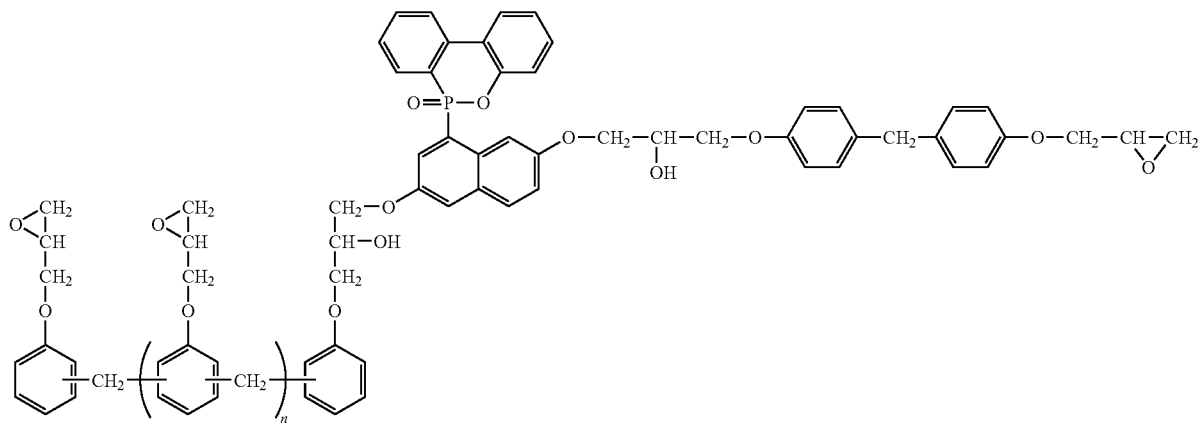

The epoxy resin obtained as a derivative from 9,10-dihydro-9-oxa-10-phosphaphenanthrene-10-oxide is a resin which is obtained by making naphthoquinone or hydroquinone react with 9,10-dihydro-9-oxa-10-phosphaphenanthrene-10-oxide to result a compound shown in Formula 10 (HCA-NQ) or Formula 11 (HCA-HQ), and then an epoxy resin is made to react with an OH group of the obtained compound to be a phosphorus-containing epoxy resin.

[Formula 10]

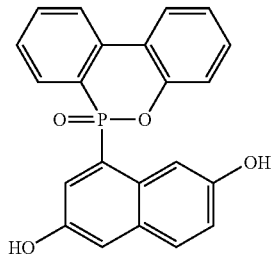

[Formula 11]

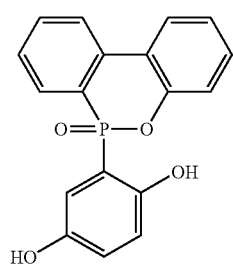

In a resin composition according to the present application, phosphorus-containing epoxy resins, component E, may be used alone or as a mixture of two types or more. However, in consideration of the total amount of component E, it is preferable to make the content of phosphorus atoms fall in the range of 0.5 wt % to 3.0 wt % against to 100 wt % of the resin composition. Since the amount of phosphorus atoms contained in the epoxy skeleton in the phosphorus-containing epoxy resin varies depending on the type, it is hard to specify the blending ratio of component E in parts by weight. Then, as described above, the amount to be added of component E is represented by the content of phosphorus atoms.

Embodiment of the Resin Coated Copper Foil

Resin coated copper foil for manufacturing a printed wiring board according to the present application has a resin layer on one side of a copper foil. The resin layer is formed of the aforementioned resin composition as a semi-cured resin layer having a thickness of 5 μm to 100 μm. The resin layer thus formed by using the above resin composition is excellent in moisture absorption resistance. As a result, even when the resin coated copper foil is stored in a high-temperature and humid environment for a long time, quality deterioration of the resin layer caused by absorbing moisture tends to decrease. Therefore, strict control of a storage environment is not required and control cost can be reduced.

When the thickness of the resin layer is less than 5 μm, it may be impossible to laminate the resin coated copper foil to the surface of an inner-layer core material having an inner layer wiring, due to the convexo concaves formed by the inner layer wiring. On the other hand, even when the thickness of the resin layer exceeds 100 μm, no problem may be caused. However, it is not productive because forming of a thick resin layer is difficult. In addition, resin coated copper foil having a thick resin layer may be almost similar to a pre-preg and results no meaning in employing a product in the form of resin coated copper foil.

The manufacturing method for copper foil is not limited and any method can be used including an electrodeposition method and a rolling method. The thickness of the copper foil is not particularly limited also. Furthermore, to the surface of the copper foil on which a resin layer will be formed, a roughening treatment can be optionally provided. When a roughening treatment is provided, the adhesion between the copper foil and the resin layer is improved. When roughening treatment is not provided, the surface is kept flat and it may result advantage in forming of a fine pitch wiring. Furthermore, a rust-proofing treatment may be applied to the surface of the copper foil. As for the rust-proofing treatment, any conventional methods, an inorganic rust-proofing treatment using zinc, zinc alloy or the like and/or an organic rust-proofing treatment using a single molecular coating of an organic compound such as benzimidazole or triazole can be used. Moreover, on the surface of the copper foil on which a resin layer will be formed, it is preferable to provide a silane coupling treatment layer.

Furthermore, to enhance adhesion with a base resin in hot pressing between the resin layer and the copper foil surface where no roughening treatment is applied by improving the wettability, a silane coupling agent layer is preferably provided on the surface of the copper foil. For example, to the copper foil having no roughening treatment provided thereto, a rust-proofing treatment can be applied and then a silane coupling agent treatment may be carried out. In the silane coupling agent treatment, various types of silane coupling agents can be used, which include an epoxy-functional silane coupling agent, an olefin functional silane coupling agent, an acryl functional silane coupling agent, an amino functional silane coupling agent and a mercapto functional silane coupling agent. When an appropriate silane coupling agent is selectively used according to the application, it may exceed 0.8 kgf/cm of peel strength.

The silane coupling agents that can be used herein will be described below more specifically. The same kind of coupling agents used in treatment of glass cloth constituting a pre-preg for a printed wiring board may be basically used. Examples thereof may include vinyl trimethoxysilane, vinyl phenyl trimethoxysilane, γ-methacryloxypropyl trimethoxysilane, γ-glycidoxy propyl trimethoxysilane, 4-glycidyl butyl trimethoxysilane, γ-aminopropyl triethoxysilane, N-β(aminoethyl)γ-aminopropyl trimethoxysilane, N-3-(4-(3-aminopropoxy)butoxy)propyl-3-aminopropyl trimethoxysilane, imidazole silane, triazine silane and γ-mercaptopropyl trimethoxysilane.

As for the method for forming a silane coupling agent layer, it can be a method generally employed such as a dipping method, a showering method and a spray method but are not particularly limited. Any method it enables contact of a silane coupling agent-containing solution with the copper foil to make adsorb most uniformly may be arbitrarily employed depending on the process design. These silane coupling agents will be dissolved in water as a solvent at a temperature of about 25° C. to make concentration of 0.5 to 10 g/l. The silane coupling agent may bond with an OH group(s) formed on the surface of the copper foil and condensate to be a film. Therefore, even if a solution with unnecessarily high concentration is used, the effect may never be remarkably enhanced. Therefore, the concentration is basically determined depending on treatment line speed, etc. However, when the concentration is lower than 0.5 g/l, the adsorption rate of the silane coupling agent may be too low not to be profitable in a general commercial base and hardly result uniform adsorption also. On the other hand, even when the concentration is made to exceed 10 g/l, the adsorption rate may never increase and it may be unfavorable economically.

Embodiment of Method for Manufacturing a Resin Coated Copper Foil

In a method for manufacturing a resin coated copper foil according to the present application, a resin varnish is prepared at first in accordance with the steps a and b described below in this order.

In step a, a resin composition is prepared by mixing component A (one or more types of resin selected from the group consisting of bisphenol-A epoxy resin, bisphenol-F epoxy resin and bisphenol-AD epoxy resin, all having an epoxy equivalent of 200 or less and which is liquid state at 25° C.), component B (a linear polymer having a crosslinkable functional group), component C (a crosslinking agent), component D (an imidazole functional epoxy resin curing agent) and component E (a phosphorus-containing epoxy resin) and amount in parts-by-weight of component E is determined to make the range of phosphorus atoms fall in 0.5 wt % to 3.0 wt % against to 100 wt % of the resin composition. At this time, the mixing order and mixing means etc. for the individual components are not particularly limited, and any popular mixing method can be applied. Since these components have been already described, detailed explanation thereof will be omitted.

Furthermore, as the phosphorus-containing epoxy resin, component E, a phosphorus-containing epoxy resin obtained as a derivative from 9,10-dihydro-9-oxa-10-phosphaphenanthrene-10-oxide and having two or more intermolecular epoxy groups, is preferably used to make phosphorus atoms concentration of the resin composition in an amount in the range of 0.5 wt % to 3.0 wt % against to 100 wt % of the resin composition.

In step (b), the resin composition is dissolved in an organic solvent to prepare a resin varnish containing resin solid content of 25 wt % to 50 wt %. At this time, as for the organic solvent, a single solvent or a mixture of two or more types of solvents selected from the group consisting of organic solvent of which boiling point is 50° C. to 200° C., such as methanol, ethanol, methyl ethyl ketone, toluene, propylene glycol monomethyl ether, dimethyl formamide, dimethyl acetamide, cyclohexanone and ethyl cellosolve, etc. may be preferably used, for the same reasons as described above. The resin varnish prepared herein is made to be a resin solid content of 25 wt % to 50 wt %. Note that the resin solid content represents the solid content (expressed by wt %) obtained after the resin varnish is heated to remove a volatile content. The range of the resin solid content shown herein can make the film thickness control most accurate when the resin varnish is applied to the surface of the copper foil. When resin solid content is less than 25 wt %, the viscosity may be too low and it makes hard to obtain a uniform film thickness because the resin varnish may flow immediately after coated on the surface of the copper foil. On the other hand, when the resin solid content exceeds 50 wt %, the viscosity may be too high and it makes hard to form a thin film on the surface of the copper foil. In addition, other solvents not specifically described above can be used as long as they can dissolve all resin components used in the present invention.

When the prepared resin varnish is coated on the surfaces of the copper foil, the coating method is not particularly limited. When the matter that the varnish must be accurately coated to result a desired thickness calculated from weight is considered, a coating method and a coating apparatus may be appropriately selected and used depending on the thickness of the layer to be formed. Furthermore, after the resin layer is formed on the surface of the copper foil, the resin layer is dried. The heating conditions may be appropriately employed to obtain a semi-cured state depending on characteristics of the resin varnish.

The semi-cured resin layer is made to be thickness of 5 μm to 100 μm after drying to prepare the resin coated copper foil according to the present invention. The reason why the thickness is limited is same as described above.

Embodiment of the Printed Wiring Board

A printed wiring board according to the present application is characterized in that the insulating layer is formed by using the resin composition. More specifically, a resin varnish is prepared by using a resin composition according to the present invention and then the resin coated copper foil is manufactured by using the resin varnish. When the resin coated copper foil is used to make a multi-layered copper clad laminate by laminating with an inner-layer core wiring board, it can be processed into a multi-layered printed wiring board. In addition, a resin varnish prepared from a resin composition according to the present invention may be impregnated to reinforcements such as glass cloth or glass paper to prepare a pre-preg for manufacturing of a copper clad laminate by a popular method followed by processing into a printed wiring board. It means that when the aforementioned resin composition is applied, it may enable manufacturing of a printed wiring board by any method well known. By the way, the printed wiring board disclosed in the present invention includes a so-called single sided board, a double-sided board and a multi-layered board having three or more layers. Now, Examples will be described below.

Example 1

In Example 1, a resin composition prepared as described below was made to be a resin varnish. Using the resin varnish, resin coated copper foil was manufactured and evaluated.

Synthesis of component E: A phosphorus-containing epoxy resin having a structural formula shown in Formula 9 was obtained in accordance with the following method. 141 parts by weight of 9,10-dihydro-9-oxa-10-phosphaphenanthrene-10-oxide (trade name: HCA, manufactured by Sanko Co., Ltd.) and ethyl cellosolve (300 parts by weight) were put into a separable four-neck glass flask equipped with a stirrer, a thermometer, a condenser and a nitrogen supply unit, and they were dissolved by heating. Thereafter, 96.3 parts by weight of 1,4-naphthoquinone (reagent grade) was added in parts with taking care for temperature rising by reaction heat. At this time, the molar ratio of 1,4-naphthoquinone to HCA (i.e., 1,4-naphthoquinone/HCA) was 0.93. After finishing the reaction, 262.7 parts by weight of Epotohto YDPN-638 (phenol novolac epoxy resin, manufactured by Tohto Kasei Co., Ltd.) and 409.6 parts by weight of YDF-170 (bisphenol-F type epoxy resin, manufactured by Tohto Kasei Co., Ltd.) were put into, and then stirred and heated to 120° C. while introducing nitrogen gas to dissolve them. Then, 0.24 parts by weight of reagent grade triphenyl phosphine was added and a reaction was performed for 4 hours at 130° C. In the phosphorus-containing epoxy resin obtained, epoxy equivalent was 326.9 g/eq and a phosphorus content was 2.0 wt %. In Examples 1 and 2 below, the component E thus obtained was used.

Preparation of a resin composition: The following components A to F were blended to prepare a resin composition containing 1.2 wt % of phosphorus atoms against to 100 wt % of the resin composition.

component A: A bisphenol-A epoxy resin having an epoxy equivalent of 200 or less and which is liquid state at 25° C. (trade name: Epotohto YD-128, manufactured by Tohto Kasei Co., Ltd.)/15 parts by weight;

component B: A linear polymer having a crosslinkable functional group, a polyvinyl acetal resin (trade name: Denka butyral 5000A, manufactured by Denki Kagaku Kogyo K.K.)/15 parts by weight;

component C: A crosslinking agent, urethane resin (trade name: Coronate AP stable, manufactured by Nippon Polyurethane Industry Co., Ltd.)/5 parts by weight;

component D: An epoxy resin curing agent, 2-phenyl-4-methyl-5-hydroxymethyl imidazole (trade name: Curezole 2P4MHZ, manufactured by Shikoku Chemicals Corp.)/3 parts by weight; and component E: A phosphorus-containing epoxy resin synthesized by the method described above/62 parts by weight as a solid.

Preparation of resin varnish: A resin varnish having 35% of a resin solid content was prepared by dissolving the resin composition comprising the components above in the solvent, mixture of methyl ethyl ketone and dimethyl formamide (a mixing ratio: methyl ethyl ketone/dimethyl formamide=1/1).

Manufacturing of a resin coated copper foil: The resin varnish was coated uniformly on the roughened surface of an electro-deposited copper foil having a nominal thickness of 18 μm. After air drying, heat treatment was performed at 140° C. for 5 minutes to obtain resin coated copper foil having a semi-cured resin layer. The thickness of the resin layer was 85 μm.

Solder blister after moisture absorption: The resin coated copper foil was stored in the chamber with constant temperature and humidity, a temperature of 30° C. and a relative humidity of 65%, for 15 hours to absorb moisture. Thereafter, a double-sided printed wiring board having an inner layer test wiring formed on both surfaces is used for the inner layer core wiring board, the resin coated copper foil was laminated on both side. More specifically, lamination was performed by stacking the resin coated copper foil to make the resin layer in contact with the surface of the inner layer core wiring board followed by hot-pressing for 2 hours at a pressure 20 kgf/cm$^2$ and a temperature 170° C. to manufacture a four-layered copper clad laminate. The laminate board was floated on a solder bath at 260° C. and the time until blistering was measured. The results are shown in Table 1 in comparison with Comparative Examples.

Example 2

In Example 2, a resin composition was prepared as described below and then a resin varnish was prepared. Using the resin varnish, resin coated copper foil was manufactured and evaluated. The procedure in Example 2 is substantially the same as Example 1 except the resin composition. Therefore, just "preparation of a resin composition" and "preparation of a resin varnish" which differ from those of Example 1 will be described more specifically.

Preparation of a resin composition: The following components A to E were blended to prepare a resin composition containing 0.9 wt % of phosphorus atoms against to 100 wt % of the resin composition.

component A: A bisphenol-A epoxy resin having an epoxy equivalent of 200 or less and which is liquid state at 25° C. (trade name: Epotohto YD-128, manufactured by Tohto Kasei Co., Ltd.)/20 parts by weight;

component B: A linear polymer having a crosslinkable functional group, a polyvinyl acetal resin (trade name: Denka butyral 5000A, manufactured by Denki Kagaku Kogyo K.K.)/24 parts by weight;

component C: A crosslinking agent, urethane resin (trade name: Coronate AP stable, manufactured by Nippon Polyurethane Industry Co., Ltd.)/7 parts by weight;

component D: An epoxy resin curing agent, 2-phenyl-4-methyl-5-hydroxymethyl imidazole (trade name: Curezole 2P4MHZ, manufactured by Shikoku Chemicals Corp.)/4 parts by weight; and component E: A phosphorus-containing epoxy resin synthesized by the method described in Example 1/45 parts by weight as a solid.

Preparation of resin varnish: A resin varnish having 30% of a resin solid content was prepared by dissolving the resin composition comprising the components above in the solvent, mixture of methyl ethyl ketone and dimethyl formamide (a mixing ratio: methyl ethyl ketone/dimethyl formamide=1/1).

Next, the "manufacturing of a resin coated copper foil" and "solder blister after moisture absorption" were carried out in the same manner as in Example 1. The results are shown in Table 1 in comparison with Comparative Examples.

Example 3

In Example 3, a resin composition was prepared as described below and then a resin varnish was prepared. Using the resin varnish, resin coated copper foil was manufactured and evaluated. The procedure in Example 3 is substantially the same as Example 1 except the resin composition. More specifically, the component different from Example 1 is just component E. So, just "synthesis of component E" will be described more specifically.

Synthesis of component E: 324 parts by weight of 10-(2, 5-dihydroxyphenyl)-10H-9-oxa-10-phosphaphenanthrene-10-oxide (trade name: HCA-HQ, manufactured by Sanko Co., Ltd.) and 300 parts by weight of ethyl cellosolve were put into a separable four-neck glass flask equipped with a stirrer, a thermometer, a condenser and a nitrogen supply unit, and they were dissolved by heating. Thereafter, 680 parts by weight of YDF-170 (bisphenol-F epoxy resin manufactured by Tohto Kasei Co., Ltd.) was added, and then stirred and heated to 120° C. while introducing nitrogen gas to dissolve them. Then, 0.3 parts by weight of reagent grade triphenyl phosphine was added and a reaction was performed for 4 hours at 160° C. In the phosphorus-containing epoxy resin obtained, epoxy equivalent was 501.0 g/eq and the phosphorus content was 3.1 wt %. In Example 3 below, the component E thus obtained was used.

Next, steps "preparation of a resin composition", "preparation of a resin varnish", "manufacturing of a resin coated copper foil" and "solder blister after moisture absorption" were carried out in the same manner as in Example 1. The results are shown in Table 1 in comparison with Comparative Examples.

Comparative Examples

Comparative Example 1

In the Comparative Example 1, a resin composition was prepared as described below and then a resin varnish was prepared. Using the resin varnish, resin coated copper foil was manufactured and evaluated. By the way, the flame retardant component used in Examples was phosphorus, but bromine was used as a flame retardant component in the Comparative Example 1.

Preparation of a resin composition: The following components a to g were blended to prepare a resin composition containing 15.4 wt % of bromine atom against to 100 wt % of the resin composition excluding a curing accelerator.

component a: A bisphenol-A epoxy resin (trade name: Epotohto YD-128, manufactured by Tohto Kasei Co., Ltd.)/15 parts by weight;

component b: A linear polymer having a crosslinkable functional group, a polyvinyl acetal resin (trade name: Denka butyral 5000A, manufactured by Denki Kagaku Kogyo K.K.)/15 parts by weight;

component c: A crosslinking agent, a urethane resin (trade name: Coronate AP stable, manufactured by Nippon Polyurethane Industry Co., Ltd.)/5 parts by weight;

component d: An epoxy resin curing agent (reagent grade of a 25% dimethyl formamide solution of dicyandiamide/3 parts by weight as a solid;

component e: A brominated epoxy resin 1 (trade name: Epiclon 1121N-80M, manufactured by DIC Corporation)/30 parts by weight, and a brominated epoxy resin 2 (trade name: BREN-304, manufactured by Nippon Kayaku Co., Ltd.)/20 parts by weight;

component f: A curing accelerator (trade name: Curezole 2E4MZ manufactured by Shikoku Chemicals Corp.)/0.5 parts by weight; and component g: Orthocresol novolac epoxy resin (trade name: Epiclon N-680, manufactured by DIC Corporation)/12 parts by weight.

As described above, differences from Examples are different components for forming a resin composition and using of a curing accelerator.

Preparation of resin varnish: A resin varnish containing a resin solid content of 35% was prepared in the same manner as in Example 1.

Manufacturing of a resin coated copper foil: Resin coated copper foil having a semi-cured resin layer having a thickness of 85 µm was prepared in the same manner as in Example 1.

Solder blister after moisture absorption: The test was carried out in the same manner as in Example 1. The results are shown in Table 1 in comparison with Examples.

Comparative Example 2

In the Comparative Example 2, the resin composition was prepared as described below and then a resin varnish was prepared. Using the resin varnish, resin coated copper foil was manufactured and evaluated. By the way, the flame retardant component used in Examples was phosphorus, but bromine was used as a flame retardant component in the Comparative Example 2.

Preparation of a resin composition: The following components a to f were blended to prepare a resin composition containing 15.4 wt % of bromine atom against to 100 wt % of the resin composition excluding a curing accelerator.

component a: Bisphenol-A epoxy resin (trade name: Epotohto YD-128, manufactured by Tohto Kasei Co., Ltd.)/15 parts by weight;

component b: A linear polymer having a crosslinkable functional group, a polyvinyl acetal resin (trade name: Denka butyral 5000A, manufactured by Denki Kagaku Kogyo K.K.)/15 parts by weight;

component c: A crosslinking agent, a urethane resin (trade name: Coronate AP stable, manufactured by Nippon Polyurethane Industry Co., Ltd.)/5 parts by weight;

component d: An epoxy resin curing agent, novolac type phenol resin (trade name: Phenolite TD-2131, manufactured by DIC Corporation)/23 parts by weight;

component e: Orthocresol novolac epoxy resin (trade name: Epiclon N-680, manufactured by DIC Corporation)/7 parts by weight;

component f: A brominated epoxy resin (trade name: BREN-304, manufactured by Nippon Kayaku Co., Ltd.)/35 parts by weight; and component g: A curing accelerator (trade name: Curezole 2E4MZ manufactured by Shikoku Chemicals Corp.)/0.5 parts by weight.

As described above, differences from Examples are different components for forming a resin composition and using of a curing accelerator.

Preparation of resin varnish: A resin varnish containing a resin solid content of 35% was prepared in the same manner as in Example 1.

Manufacturing of a resin coated copper foil: Resin coated copper foil having a semi-cured resin layer having a thickness of 85 µm was prepared in the same manner as in Example 1.

Solder blister after moisture absorption: The test was carried out in the same manner as in Example 1. The results are shown in Table 1 in comparison with Examples.

Comparative Example 3

In the Comparative Example 3, the resin composition was prepared as described below and then a resin varnish was prepared. Using the resin varnish, resin coated copper foil was manufactured and evaluated. By the way, the same flame retardant component phosphorus used in Examples was used.

Preparation of a resin composition: The following components a to e were blended to prepare a resin composition containing 1.2 wt % of phosphorus atoms against to 100 wt % of the resin composition.

component a: Bisphenol-A epoxy resin (trade name: Epotohto YD-128, manufactured by Tohto Kasei Co., Ltd.)/15 parts by weight;

component b: A linear polymer having a crosslinkable functional group, a polyvinyl acetal resin (trade name: Denka butyral 5000A, manufactured by Denki Kagaku Kogyo K.K.)/15 parts by weight;

component c: A crosslinking agent, a urethane resin (trade name: Coronate AP stable, manufactured by Nippon Polyurethane Industry Co., Ltd.)/5 parts by weight;

component d: An epoxy resin curing agent (a 25% dimethyl formamide solution of dicyandiamide (reagent)/3 parts by weight; and component e: A phosphorus-containing epoxy resin as used in Example 1/62 parts by weight as a solid.

Preparation of resin varnish: A resin varnish containing a resin solid content of 35% was prepared in the same manner as in Example 1.

Manufacturing of a resin coated copper foil: Resin coated copper foil having a semi-cured resin layer having a thickness of 85 μm was prepared in the same manner as in Example 1.

Solder blister after moisture absorption: The test was carried out in the same manner as in Example 1. The results are shown in Table 1 in comparison with Examples.

TABLE 1

| Samples | Solder blister |
| --- | --- |
| Example 1 | 600 seconds or more |
| Example 2 | |
| Example 3 | |
| Comparative Example 1 | 157 seconds |
| Comparative Example 2 | 273 seconds |
| Comparative Example 3 | 66 seconds |

Comparison Between Examples and Comparative Examples

In the solder blister after moisture absorption of Examples 1 to 3, the times until blister happens are 600 seconds or more. In contrast, in Comparative Examples 1 to 3, the times until blister happens are 300 seconds or less. As a result, it was clearly found that, in the resin layer using a resin composition according to the present application, even if a semi-cured state is made to absorb moisture, quality deterioration of the resin composition according to the present invention after moisture absorption is low.

INDUSTRIAL APPLICABILITY

A semi-cured resin layer formed of a resin composition according to the present application is excellent in moisture absorption resistance and even if it is stored in a high-temperature and humid environment for a long time, the quality of the resin layer after fully-cured is not made poor. In addition, since a resin composition according to the present application is a so-called halogen-free composition, which provides a low environment load, it is preferable as an object of the Act on Promoting Green Purchasing. Accordingly, it enables manufacturing of a pre-preg or resin coated copper foil for a high-quality printed wiring board. In addition, the resin composition can be prepared by a simple method without need to employ a specific method.

In addition, to form a thin inner-layer insulating layer for a multi-layered printed wiring board, resin coated copper foil is generally used. In formation of the resin layer of such resin coated copper foil, the resin composition of the present invention is preferably used. This is because, the resin coated copper foil manufactured is excellent in long-term storage stability even if it is stored in high-temperature and humid environment for a long time.

Further, the printed wiring board manufactured by using the resin composition or the resin coated copper foil of the present invention may hardly perform poor solder blister which tends to occur when the resin layer absorbs moisture to be deteriorated, is suppressed. For this reason, the quality of the printed wiring board may be significantly improved.

The invention claimed is:

1. A resin composition for forming an insulating layer of a printed wiring board, the resin composition comprising components A to E:

(A) at least one epoxy resin, which is liquid at 25° C. and has an epoxy equivalent weight of 200 or less, and which is selected from the group consisting of bisphenol-A epoxy resin, bisphenol-F epoxy resin and bisphenol-AD epoxy resin, said component A provided in an amount of 3 to 20 wt % of the overall composition;

(B) a polyvinyl acetal resin, said component B provided in an amount of 3 to 30 wt % of the overall composition;

(C) a urethane resin, said component C provided in a positive amount of not more than 10 wt % of the overall composition;

(D) an imidazole curing agent; and (E) a phosphorus-containing epoxy resin, said component E provided in an amount yielding a phosphorous atom content in the overall composition of 0.5 wt % to 3.0 wt %;

wherein the resin composition resists moisture absorption when semi-cured, and a copper clad laminate manufactured with the resin composition exhibits a solder blister time of 600 seconds or more when the copper clad laminate is floated on a solder bath at 260° C.; wherein the copper clad laminate is manufactured by: preparing a resin varnish with the resin composition; coating a copper foil with the resin varnish; drying the coated copper foil to form a semi-cured resin layer; exposing the dried coated copper foil to a temperature of 30° C. and a relative humidity of 65% for 15 hours; and laminating the exposed coated copper foil to an inner layer core wiring board by hot-pressing.

2. The resin composition for forming an insulating layer of a printed wiring board according to claim 1, wherein component E comprises at least one epoxy resin obtained from 9,10-dihydro-9-oxa-10-phosphaphenanthrene-10-oxide and having two or more intermolecular epoxy groups.

3. The resin composition for forming an insulating layer of a printed wiring board according to claim 2, wherein the at least one epoxy resin obtained from 9,10-dihydro-9-oxa-10-phosphaphenanthrene-10-oxide and having two or more intermolecular epoxy groups comprises one or more compounds represented by any one of Formulas 1 to 3:

[Formula 1]

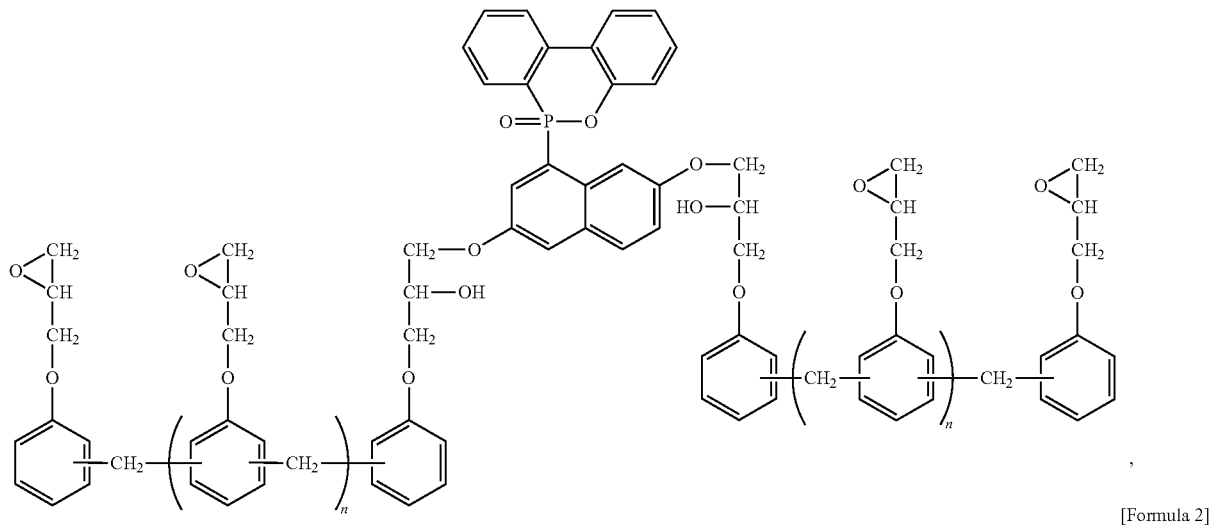

[Formula 2]

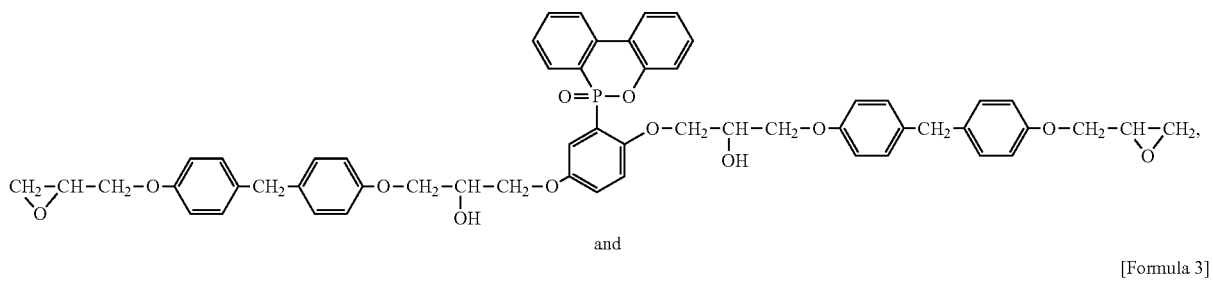

and

[Formula 3]

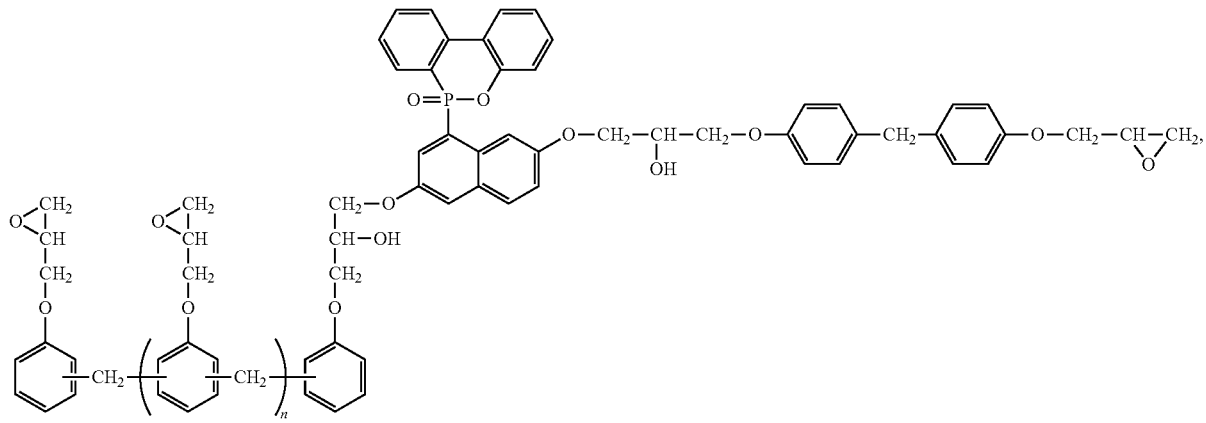

where n represents a number of repeating units.

4. A resin coated copper foil for manufacturing a printed wiring board comprising a semi-cured resin layer on a surface of the copper foil, wherein the semi-cured resin layer is formed with the resin composition according to claim 1 and has a thickness of 5 μm to 100 μm.

5. The resin coated copper foil for manufacturing a printed wiring board according to claim 4, wherein the surface of the copper foil further comprises a silane coupling treatment layer.

6. A method for manufacturing the resin coated copper foil for manufacturing a printed wiring board according to claim 4, comprising:
preparing the resin composition;
dissolving the resin composition in an organic solvent to prepare a resin varnish containing a resin solid content of 25 wt % to 50 wt %;
applying the resin varnish on the surface of the copper foil; and
drying the resin varnish to form the semi-cured resin layer having a thickness of 5 μm to 100 μm.

7. The method for manufacturing the resin coated copper foil for manufacturing a printed wiring board according to claim 6, wherein component E comprises at least one epoxy resin obtained from 9,10-dihydro-9-oxa-10-phosphaphenanthrene-10-oxide and having two or more intermolecular epoxy groups.

8. A printed wiring board comprising an insulating layer formed by curing the resin composition according to claim 1.

* * * * *